United States Patent [19]

Dohjo et al.

[11] Patent Number: 5,170,244
[45] Date of Patent: Dec. 8, 1992

[54] ELECTRODE INTERCONNECTION MATERIAL, SEMICONDUCTOR DEVICE USING THIS MATERIAL AND DRIVING CIRCUIT SUBSTRATE FOR DISPLAY DEVICE

[75] Inventors: Masayuki Dohjo; Yasuhisa Oana; Mitsushi Ikeda, all of Yokohama, Japan

[73] Assignee: Kabushiki Kaisha Toshiba, Kawasaki, Japan

[21] Appl. No.: 699,296

[22] Filed: Apr. 8, 1991

Related U.S. Application Data

[60] Division of Ser. No. 521,035, May 9, 1990, Pat. No. 5,028,551, which is a continuation of Ser. No. 411,262, Sep. 25, 1989, Pat. No. 4,975,700, which is a continuation of Ser. No. 220,987, Jul. 18, 1988, abandoned, which is a continuation of Ser. No. 939,117, Dec. 8, 1986, abandoned.

[30] Foreign Application Priority Data

| Mar. 6, 1986 | [JP] | Japan | 61-48910 |
| Jun. 18, 1986 | [JP] | Japan | 61-141694 |
| Sep. 5, 1986 | [JP] | Japan | 61-209066 |

[51] Int. Cl.⁵ .................. H01L 23/54; H01L 23/48; H01L 23/52
[52] U.S. Cl. ........................... 257/72; 257/60; 257/761; 257/764
[58] Field of Search ............... 357/71, 67, 80; 420/427, 429; 359/87, 88, 54

[56] References Cited

U.S. PATENT DOCUMENTS

| 3,754,168 | 8/1973 | Cunningham et al. | 420/429 |
| 3,791,821 | 2/1974 | Buckman, Jr. | 420/427 |
| 4,062,679 | 12/1977 | Marsh et al. | 420/427 |
| 4,626,282 | 12/1986 | Naya et al. | 420/427 |
| 4,707,723 | 11/1987 | Okamoto et al. | 357/67 |
| 4,975,760 | 12/1990 | Dohjo et al. | 357/71 |

Primary Examiner—Rolf Hille
Assistant Examiner—S. V. Clark
Attorney, Agent, or Firm—Oblon, Spivak, McClelland, Maier & Neustadt

[57] ABSTRACT

There is provided a semiconductor device using a molybdenum-tantalum alloy having a tantalum composition ratio of 30 to 84 atomic percent. Using this Mo-Ta alloy, there is provided an electrode interconnection material comprising a multi-layered structure having an underlying metal film having a crystalline form of a body-centered cubic system and overlying a molybdenum-tantalum alloy film having a tantalum composition ratio of above 84 atomic percent. Further using this Mo-Ta alloy, there is provided a display device driving circuit substrate comprising an insulating substrate, a plurality of address lines and data lines intersecting each other on the substrate, the address line being formed of a molybdenum-tantalum alloy having a tantalum composition ratio of 30 to 84 atomic percent, a plurality of thin-film transistors each formed at an intersection of said address and data lines and having its gate electrode connected to an address line and its source electrode connected to data line, and a plurality of display electrodes connected to the drain electrode of the thin-film transistor.

18 Claims, 7 Drawing Sheets

ELECTRODE INTERCONNECTION MATERIAL, SEMICONDUCTOR DEVICE USING THIS MATERIAL AND DRIVING CIRCUIT SUBSTRATE FOR DISPLAY DEVICE

This is a division of application Ser. No. 07/521,035, filed on May 9, 1990, now U.S. Pat. No. 5,028,551, which is a divisional of appln. Ser. No. 07/411,262, filed Sep. 25, 1989, now U.S. Pat. No. 4,975,700, which is a cont. of Ser. No. 07/220,987 filed on Jul. 18, 1988 now abandoned, which is a cont. of Ser. No. 06/939,117 filed Dec. 8, 1985 now abandoned.

BACKGROUND OF THE INVENTION

This invention relates to an electrode interconnection material, semiconductor device using this material and driving circuit substrate for display device.

Recently, attention has been focused on an active matrix type liquid crystal display device in which a thin-film transistor (TFT) using an amorphous silicon (a-Si) film is employed as a switching element. This is because, if a TFT array is formed using an amorphous glass substrate and a-Si film producible at a low temperature, it is possible to implement an inexpensive panel display device (flat type television) of a larger screen, high quality and high definition.

Where an inverted staggered TFT is adopted having, for example, a glass substrate, gate electrode interconnection on the substrate and insulating film and a-Si film on the gate electrode interconnection, since the thin semiconductor film and data line are formed on the gate electrode and address line irrespective of their restricted thickness, it is necessary to form a thin electrode interconnection of an adequately small thickness. In the formation of a multi-layered structure an underlying electrode interconnection is tapered at the stepped edge to prevent a breakage of the overlying layer. For this reason, the following requirements are needed: for example, the workability; formability of a stable oxide film as a gate insulating film; and resistance to, for example, a sulfuric acid and hydrogen peroxide at a subsequent washing step. Conventionally, as a gate electrode interconnection material which satisfies the aforementioned requirements, use has been made of various metal films, such as tantalum and titanium. In order to attain a larger image screen and high definition, a material is desired which has a smaller electrical resistance, better workability and excellent resistance to chemicals at the subsequent step. These characteristics are required for source and drain electrode interconnection materials if a staggered TFT structure is adopted in which source and drain interconnections are formed on a substrate. A similar problem also arises from a liquid crystal display device which is not of an active matrix type.

In order to obtain a greater image screen on an active matrix type display device using the smallest possible display pixels, fine and longer gate and data lines are necessary as signal lines to TFT. Furthermore, the resistance must be made adequately smaller so as to eliminate a waveform deformation resulting from the delay of a pulse signal.

Where an active matrix type liquid crystal display device of a greater image screen and high definition is achieved, use is made of a much greater number of thin film transistors. In an array of 400 address lines×400 data lines, for example, 160000 pixels are required. It is difficult to completely manufacture so many thin-film transistors in an array, involving various faults, such as a short-circuiting among the interconnection layers in a multi-layered film structure, short-circuiting of a capacitor, open-circuiting of the interconnection and faults of the thin-film transistor. If a point fault is allowed for the display device, it is possible to readily remedy the open-circuiting of the interconnection layers. That is, even if the address line is broken, it can be remedied by supplying a signal from each end of the address line. The short-circuiting of the capacitor which is stored with a signal voltage can be avoided because, if the OFF resistance of thin-film transistor is made enough great and if the resistivity of the liquid crystal is made great, it is not necessary to provide such a capacitor.

The short-circuiting between the interconnection layers causes a fatal defect and if, for example, a short-circuiting occurs between the address and data lines a line fault occurs along the interconnection layer, failing to readily remedy such defect.

As a method for preventing a short-circuiting between the layers in the multi-layered structure, a multi-layered insulating film structure has been proposed in Japanese Patent Publication (Kokoku) No. 60-54478 which forms address lines and gate electrode of tantalum, anodically oxidizes the surface of the resultant structure and deposits an $SiO_2$ or $Si_3N_4$ film. According to this method the resistance of the address lines is increased due to the anodic oxidation of tantalum. In a thin-film transistor structure of, for example, 220×240 pixels for a 44 mm×60 mm image screen, if a 150 nm-thick address line of tantalum with a line resistance of about 60KΩ is oxidized down to about 700 Å, then the line resistance become about 110KΩ. For an increasing line resistance a waveform distortion becomes greater due to a delay of an address pulse signal. As a result, a time discrepancy occurs upon the writing of data into the input terminal and final end of the address line, thus impairing the uniformity of an image quality. If the thickness of the tantalum film is increased, then the line resistance can be reduced, but the tantalum film is peeled for too thick a tantalum film, providing a cause for the open-circuiting of the data line.

Molybdenum is known as a material whose resistance is smaller than tantalum. Since, therefore, molybdenum has a poor resistance to chemicals and cannot be washed in a mixture solution of a sulfuric acid and hydrogen peroxide and since a better insulating film cannot be formed on the surface, no adequate characteristic is provided which is required for the address lines at the active matrix substrate.

A similar problem also occurs in a semiconductor integrated circuit using a single crystalline silicon substrate. For example, a memory integrated circuit typically represented by, for example, a dynamic RAM is more and more integrated in its packing density. As a gate electrode interconnection of a MOS transistor which has heretofore been used for the memory integrated circuit use has usually been made of an impurity-doped polysilicon. However, too great a resistivity is involved for the polysilicon in the implementation of the microminiaturization and high integration density of the device or element. For example, molybdenum silicide ($MoSi_2$) is known as a material which is smaller in resistivity than the polysilicon. If a dynamic RAM of about 1M bit is to be implemented using such a material, then an increase in dissipation power, signal delay, noise problem, etc. occurs due to the resistance of the electrode interconnection.

SUMMARY OF THE INVENTION

It is accordingly the object of this invention to provide an electrode interconnection material using an alloy of a smaller electrical resistance, semiconductor device allowing the microminiaturization and high integration density of elements, and driving circuit substrate for display device implementing a larger image screen and higher image quality with the use of such a material.

According to this invention, an Mo-Ta alloy is employed as a gate electrode material of a TFT with the use of an a-Si film or its drain and source electrodes and as a gate electrode interconnection material over a single crystalline silicon substrate, noting that the Ta composition ratio is 30 to 84 atomic percent. A total amount of Mo and Ta may be within a range of about 95 atomic percent in which case the other materials may be contained in a range of less than 5 atomic percent, such as carbon, oxygen, argon, hydrogen and nitrogen.

According to this invention, the Mo-Ta alloy is smaller in resistivity than those metals such as Ta, Mo and Ti and even smaller than $MoSi_2$. It has also, a workability, better resistance to various treating liquid and excellent ohmic junction with a semiconductor, such as silicon.

Tantalum has two kinds of crystal structures: a tetragonal type and body centered cubic type. Ta of the tetragonal system is referred to as $\beta$-Ta with a lattice constant of $a_0 = 5.34$ Å and $c_0 = 9.94$ Å and the resistivity of the deposited thin film is $\rho = 180$ to $200$ $\mu\Omega$·cm. That thin film usually assumes such a crystalline form. Ta of a body-centered cubic lattice is referred to as an $\alpha$-Ta with a lattice constant of $a_0 = 3.30$ Å and resistivity of the deposited thin film is $\rho = 10$ to $150$ $\mu\Omega$·cm. Bulk is formed usually in such a crystalline form. $\alpha$-Ta is markedly small in resistivity. $\alpha$-Ta is very difficult to treat in the form of a thin film due to its unstable resistance, its greater resistance temperature coefficient of 100 to 300 ppm/°C., its readiness to crack, its uneven surface, its peelability and so on.

The Mo-Ta alloy of this invention is of a thin-film type and easily treatable in the form of the thin film as in $\beta$-Ta but still has a small resistivity characteristic as in $\alpha$-Ta. It may be considered that the mixing of Mo into Ta gives a crystalline structure of a body-centered cubic lattice type as in the case of the $\alpha$-Ta to provide an $\alpha$-Ta and Mo alloy with a smaller resistance. The Mo-Ta alloy usually assumes a tetragonal structure, in the case of a thin film, within a greater Ta composition ratio range (more than 84%). If, on the other hand, an Mo-Ta alloy film is multi-layered on an underlying metal film of a body-centered cubic type, the alloy film takes on a body-centered cubic structure in the case of a greater Ta composition ratio range (more than 84%) due to the specific crystalline structure on the underlying metal film like the epitaxial growth of crystal. As a result, a low-ohmic electrode interconnection can be realized irrespective of the value of the Ta composition ratio.

According to this invention, since the address interconnection and gate electrode are prominently lower in resistance in the driving circuit substrate for display device, an address signal propagation delay time can adequately be decreased even if a high definition is attained on a greater image screen. Furthermore, the resistance can be reduced without increasing the thickness of the address interconnection layer and taper etching can also be effected readily, thus preventing a breakage of the overlying data line. An anodic oxidation film of a better quality can be formed for the address line and gate electrode of this invention. For this reason, a multi-layered insulating film of the anodic oxide film and $SiO_2$ film formed by, for example, a CVD (Chemical Vapor Deposition) is employed as a gate insulating film, and at the intersection of the address and data lines a thin semiconductor film is formed on that gate insulating film to provide an insulating interlayer.

DETAILED DESCRIPTION OF THE PREFERRED EMBODIMENT

The embodiment of this invention will now be described below with reference to the accompanying drawings.

Various metal or alloy films were systematically experimented for an electrode interconnection material for a semiconductor device, with the use of an a-Si film, polycrystalline silicon film, single crystalline silicon substrate, etc. As a result of the experiments, it has been found that, within a restricted composition range of Ta and Mo, an interconnection material is obtained which, upon comparison with the Ta or Mo film for a conventional interconnection in terms of its electrical resistance, has a lower electrical resistance, as well as excellent characteristics in terms of its workability, oxide film formation and ohmic contact property in relation to the silicon.

That is, according to this invention a semiconductor device is provided which is characterized by using, as an electrode interconnection material, an Mo-Ta alloy film with a Ta composition range of 30 to 84 atomic percent.

The composition of an Mo-Ta alloy film for use as the interconnection material of a semiconductor device according to this invention is restricted as set forth below. For less than 30 atomic percent of Ta, the alloy film reveals a greater electrical resistance and poor oxide film forming property and poor acid-resistance with a mixed solution. For Ta exceeding 84 atomic percent, the resultant alloy film manifests a better workability, as well as a better oxide film forming property and better acid-resistance with a mixed solution, but involves a greater electrical resistance.

Before explaining an embodiment of this invention as applied to a practical device, comparison will be made in various characteristics between an Mo-Ta alloy film per se of this invention and other electrode interconnection film materials. In this connection reference should be invited to the following Table, noting that in relation to the contents of Mo and Ta in Table their decimal point et seq. are cancelled.

TABLE

|  |  | Examples Mo (at %) | | | | | | | | | | | | Controls | | | | |
|---|---|---|---|---|---|---|---|---|---|---|---|---|---|---|---|---|---|---|
|  |  | 90 | 80 | 75 | 70 | 60 | 50 | 40 | 30 | 20 | 16 | 5 | 2 | | | | | |
|  |  | | | | | | Ta (at %) | | | | | | | | | | | |
|  |  | 10 | 20 | 25 | 30 | 40 | 50 | 60 | 70 | 80 | 84 | 95 | 98 | Ti | Cr | Mo | Ta | MoSi$_2$ |
| resistivity ($\times 10^{-5}$ $\Omega \cdot$cm) | after deposition | 5.2 | 5.1 | 4.9 | 4.3 | 3.4 | 3.8 | 4.5 | 4.0 | 3.4 | 3.4 | 18.2 | 18.4 | 47 | 13 | 5.3 | 26 | 91 |
|  | 300° C. after heat-treatment | 5.0 | 4.9 | 4.7 | 4.0 | 3.2 | 3.5 | 4.1 | 3.6 | 3.2 | 3.2 | 17.1 | 17.3 | 46 | 13 | 5.0 | 22 | 99 |
|  | 1000° C. after heat-treatment | 4.4 | 4.3 | 4.0 | 1.6 | 1.4 | 1.5 | 2.0 | 1.7 | 1.6 | 1.6 | 9.2 | 9.4 | 45 | 13 | 4.5 | 20 | 75 |
| workability (dry) | | ○ | ○ | ○ | ○ | ○ | ○ | ○ | ○ | ○ | ○ | ○ | ○ | Δ | Δ | ○ | ○ | ○ |
| taper formation | | ○ | ○ | ○ | ○ | ○ | ○ | ○ | ○ | ○ | ○ | ○ | ○ | Δ | x | ○ | ○ | ○ |
| thermal oxidation film formation | | x | x | Δ | ○ | ○ | ○ | ○ | ○ | ○ | ○ | ○ | ○ | x | x | x | ○ | ○ |
| anodic oxidation film formation | | x | x | Δ | ○ | ○ | ○ | ○ | ○ | ○ | ○ | ○ | ○ | x | x | x | ○ | ○ |
| washing with H$_2$SO$_4$ + H$_2$O$_2$ solution | | x | x | x | ○ | ○ | ○ | ○ | ○ | ○ | ○ | ○ | ○ | x | ○ | x | ○ | ○ |
| ohmic contact with silicon | | ○ | ○ | ○ | ○ | ○ | ○ | ○ | ○ | ○ | ○ | ○ | ○ | x | x | ○ | ○ | ○ |
| no reactivity with SiO$_2$ film | | Δ | Δ | ○ | ○ | ○ | ○ | ○ | ○ | ○ | ○ | ○ | ○ | Δ | Δ | Δ | ○ | ○ |

Respective electrode interconnection films are formed at room temperature by virtue of a sputtering method. As evident from Table, an alloy film of this invention, after deposited at room temperature, reveals a smaller resistivity than those of Ti, Cr, β-Ta and MoSi$_2$ films and, for less than 84 atomic percent of Ta in particular, than an Mo film. The alloy film, when heat-treated after that deposition step, manifests a still lower resistivity. Furthermore, the alloy film also shows an excellent dry-etching workability as in the case of an MoSi$_2$ film and allows a ready formation of a taper. No better thermal oxidation film is obtained for the Mo, Ti and Cr film. The alloy film according to this invention shows an excellent thermal oxidation and, in addition, an excellent resistance to a mixture solution of H$_2$SO$_4$ and H$_2$O$_2$ which has extensively been used as a washing liquid. It has further been found that the alloy film of this invention has a better compatibility with an Si-used semiconductor device due to its excellent ohmic contact with Si and its low reactivity with an SiO$_2$.

Evaluation was made, by a rating of ○ (better), Δ (somewhat better) and × (poor), for the dry etchability of a CF$_4$ system and for taper angle controllability by the dry etching of the CF$_4$ system. For a thermal oxidation film formation, evaluation was made as to whether or not an oxide film free from any pinholes was obtained at a temperature of about 400° C. with a breakdown electric field of above $3 \times 10^6$ V/cm and leakage current density of $1 \times 10^{-8}$ A/cm$^2$. For the formation of an anodic oxidation film, evaluation was made as to whether or not a pinholeless oxide film was obtained at a temperature of above 400° C. with a breakdown electric field of above $3 \times 10^6$ V/cm and leakage current density of below $1 \times 10^{-8}$ A/cm$^2$. For an ohmic contact with silicon, evaluation was made as to whether or not an interface is formed by a complete MoSi$_2$ of a better ohmic contact and, for a no-reactivity with the oxide film, evaluation was made as to whether or not a reaction occurred at a temperature of about 400° C.

Figure 8:
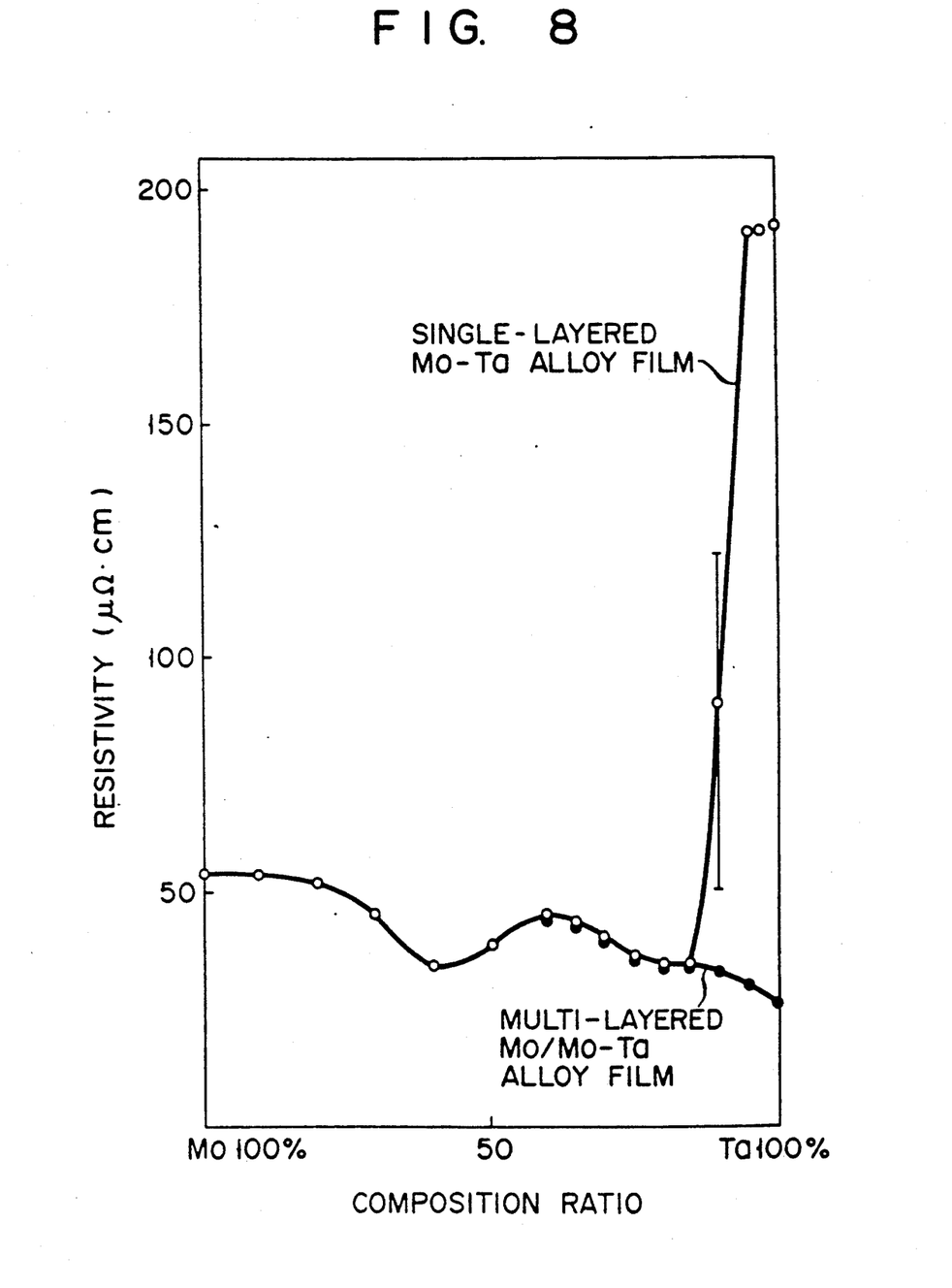
FIG. 8 shows a comparison in resistivity between an electrode interconnection material of this invention for a multi-layered structure and a single-layered structure.

FIG. 8 shows a comparison in resistivity between an Mo-Ta alloy film formed as a single-layered film on a glass substrate by a sputtering method and a multi-layered film with an Mo-Ta alloy film formed on an underlying Mo film. When the composition ratio of Ta exceeds 84 atomic percent for the single-layered film, the resistivity increases abruptly. Even when the composition ratio of Ta is increased (to more than 84 atomic percent) for a multi-layered film, the resistivity is not increased. This is a marked difference upon comparison with the single-layered film.

The film may be formed by the sputtering method, as well as by, for example, an electron beam evaporation method. Since the underlying metal film primarily determines the crystal structure of the overlying Mo-Ta alloy film, it is only necessary for the underlying metal film to have a thickness of nearly above 100 Å. As the body-centered cubic lattice type metal, use may be made of V, Cr, Fe, Nb, Mo and W whose lattice constant is similar to that of Mo and Ta, as well as an Mo-Ta alloy whose Ta composition ratio is within a range of 0 to 84 atomic percent.

Figure 9A:
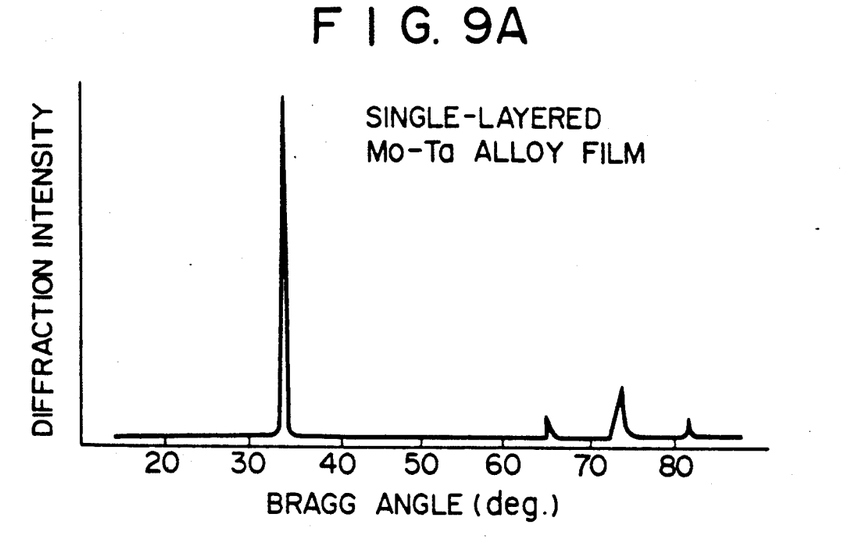
FIGS. 9A and 9B show the X-ray diffraction data of an electrode interconnection material of this invention for a multi-layered structure and that of a single-layered structure.
Figure 9B:
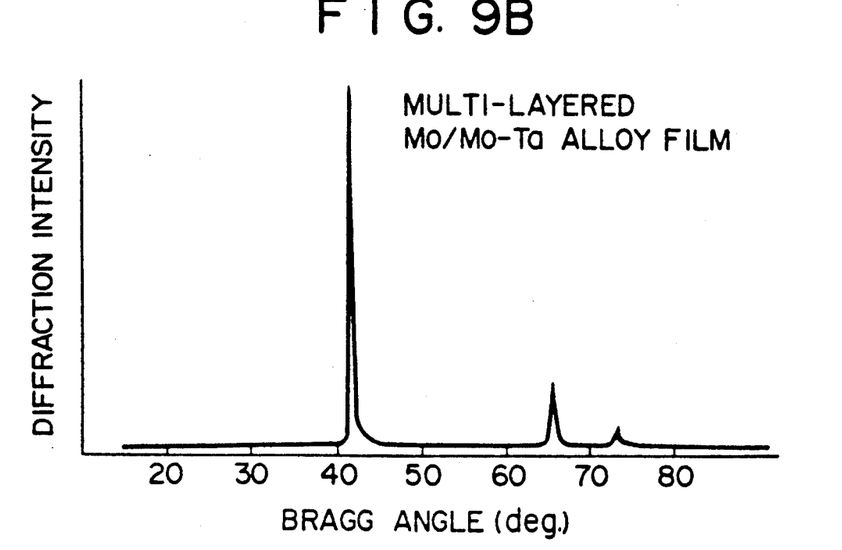

FIGS. 9A and 9B show the results of the X-ray diffractions of a single-layered Mo-Ta alloy film (above 84% of Ta) and multi-layered Mo/Mo-Ta film (above 84% of Ta), respectively. From these it has been confirmed that the single-layered Mo-Ta alloy film with above 84% of Ta is of a tetragonal type whereas the multi-layered film with the Mo film as an underlying film is of a body-centered cubic type. Such a difference in their crystalline structures is responsible for a marked difference in the resistivities in FIG. 8.

A practical form of a device using the electrode material of this invention will be explained below.

Figure 1:
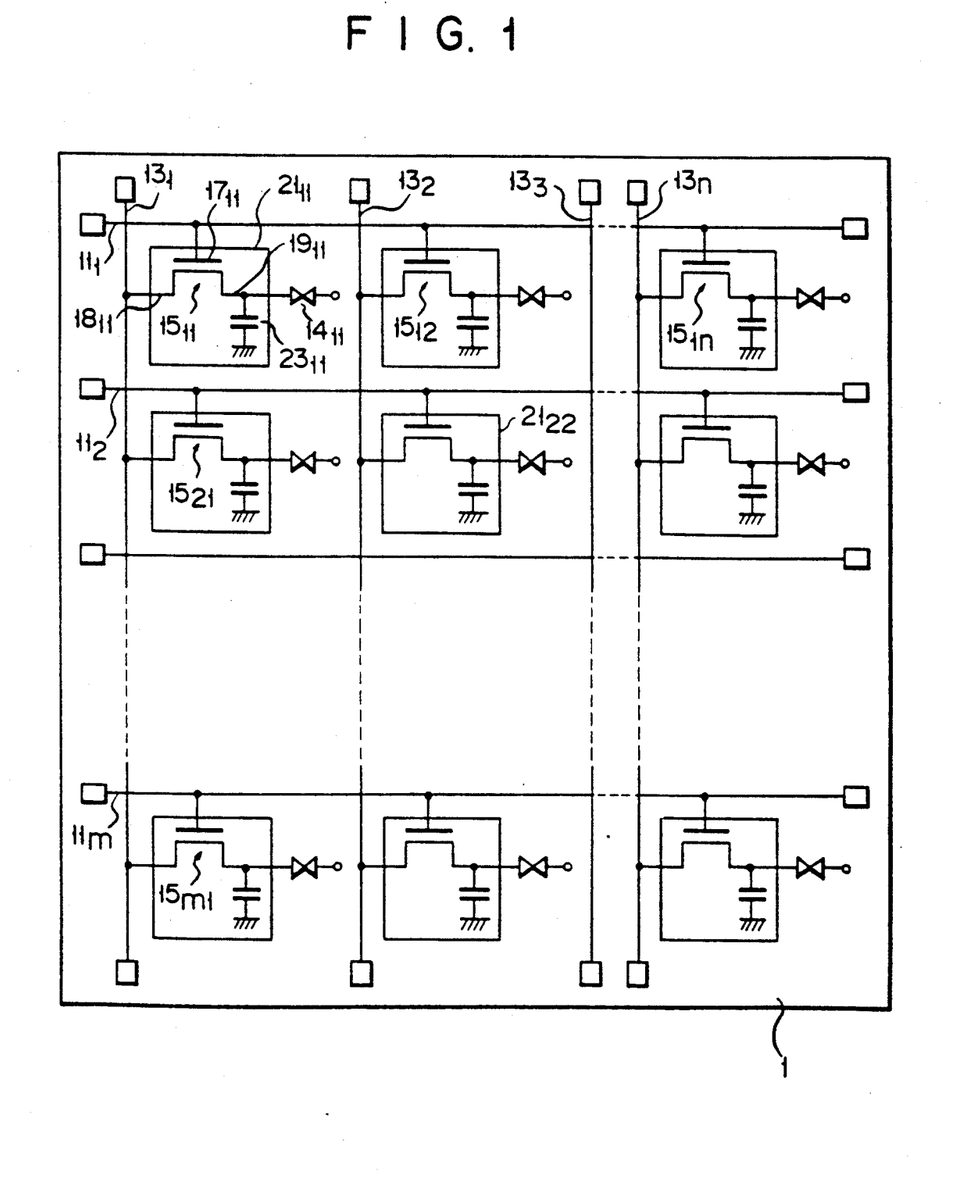
FIG. 1 is an equivalent circuit diagram showing an active matrix type liquid crystal display device according to one embodiment of this invention.

FIG. 1 is an equivalent circuit diagram showing an interconnection material of this invention as applied to an active matrix type liquid crystal display device using an inverted staggered type TFT. Address lines 11 ($11_1$, $11_2$, ..., $11_m$) and data lines 13 ($13_1$, $13_2$, ..., $13_n$) are arranged as a matrix array on glass substrate 1 with TFT 15 ($15_{11}$, ..., $15_{mn}$) placed in a corresponding intersection. TFT $15pq$ (p=1, 2, ..., m; q=1, 2, ..., n) has its gate electrode $17pq$ connected to address line $11p$, its source electrode $18pq$ to data line $13q$ and its drain electrode $19pq$ connected to liquid crystal cell $14pq$ via pixel electrode $21pq$. Capacitor $23pq$, though shown in FIG. 1, can be omitted. Gate electrode $17pq$ is formed, in reality, integral with address line $11p$.

Figure 2:
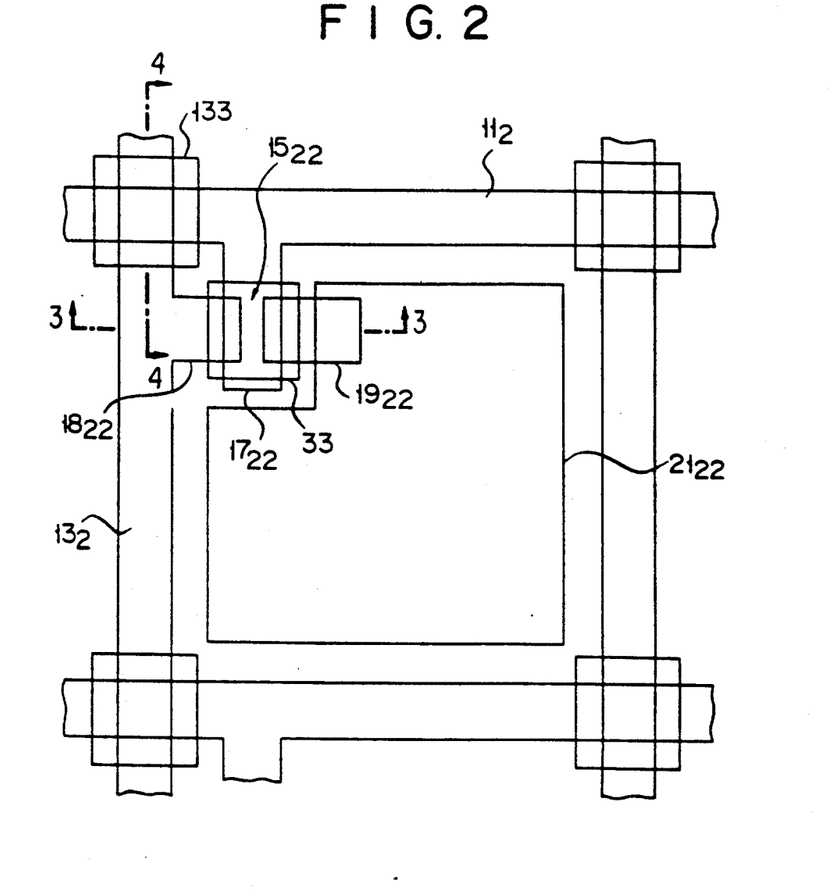
FIG. 2 is an enlarged plan view showing a major portion of an active matrix substrate in FIG. 1.

FIG. 2 is an enlarged plan view showing one pixel area ($21_{22}$) in the substrate in FIG. 1.

Figure 3:
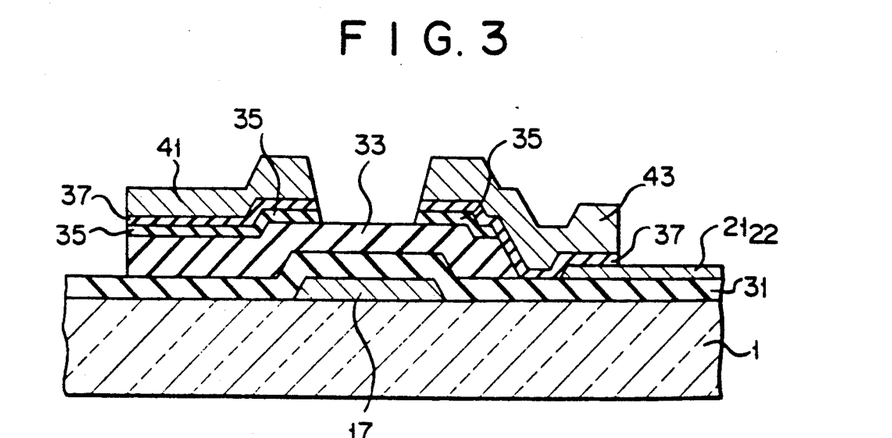
FIG. 3 is a cross-sectional view, as taken along line A-A' in FIG. 2, showing the active matrix substrate with no underlying metal film used.

A liquid crystal display device is manufactured as follows. Reference is invited to FIG. 3. An Mo-Ta alloy film was deposited by sputtering on glass substrate 1 and the resultant structure was patterned by a PEP (photo-engraving process) to form gate electrode 17. Gate electrode 17 was formed of the same material as that of address line 11 (See FIG. 1) and formed, by the same process, integral with the address line. In order to prevent a possible step breakage on gate electrode 17 and on the address line at that step their edges were tapered. For this reason, a ready taper etching step was able to be performed using a resist and $CF_4+O_2$. Gate electrode 17 of this embodiment was 200 nm in thickness and 30 μm in width, noting that the gate electrode has a thickness the same as that of the address line. Then 200 nm-thick $Si_3N_4$ film 31 was formed, as a gate insulating film, on the resultant structure. Then 300 nm-thick undoped a-Si film 33, 50 nm-thick n+ type a-Si film 35 and 50 nm-thick Mo film 37 were formed in that order. These three layers were left by etching at the thin-film transistor section and at the respective intersection of address line 11 and data line 13 on address line 11. What is important at this step was a process before gate insulating film 31 was deposited. The gate electrode was subjected by PEP to a patterning and a larger amount of organic (the left resist, for example,) and inorganic contaminants was present in the surface of the gate electrode. A washing step was carried out by immersing the glass substrate into a mixture solution of $H_2SO_4$ and $H_2O_2$ with the gate electrode formed on the glass substrate. The gate electrode of the alloy film of this invention revealed an adequate corrosion- and etching-resistance to a washing liquid. Then, display electrode 21 for the respective pixel was formed by a 150 nm-thick ITO (indium tin oxide) film. Finally, the resultant structure was subjected to an Al-film deposition and patterning to form data line 13 and continuous source electrode 41 and drain electrode 43. Source electrode 41 was formed integral with data line 13 in FIG. 1 to contact with display electrode 21. In this case a liquid crystal layer, if sandwiched between the active matrix substrate and opposite electrode substrate, provides a liquid crystal display device.

If the washing step is inadequate, a faulty breakdown voltage occurs between the drain, source and gate electrode and thus an interlayer short-circuiting occurs, causing, for example, a line defect on an image display. In the embodiment of this invention, adequate washing was able to be done due to the chemical corrosion resistance. It was, therefore, evidenced possible to prevent occurrence of such a defect.

Although $Si_3N_4$ film 31 has been explained as being deposited as a gate insulating film on gate electrode 17, it is helpful to form a thermal oxidation film on the surface of gate electrode 17 prior to the deposition of the $Si_3N_4$ film. In actual practice, after the gate electrode has been formed, 160 nm-thick oxide film was formed by a thermal oxidation process for one hour at 400° C. in an oxygen atmosphere under atmospheric pressure. The thermal oxidation film had a breakdown electric field of above $5.2 \times 10^5$ V/cm and specific dielectric constant of 23. Where subsequent to the formation of the thermal oxidation film the $Si_3N_4$ film is deposited to provide a gate insulating film, it is possible to effectively prevent such a defect resulting from the layer-to-layer short-circuiting. Furthermore, the second insulating film can be thinned, thus offering an advantage of lowering the threshold voltage of TFT's. Forming a thermal oxidation film on the whole gate interconnection area or intersected interconnection, not to mentioned that gate electrode area, prevents defects resulting from the interlayer short-circuiting at that intersection in particular. A good-quality oxide film can be formed by anodically oxidizing the gate electrode and the other surface.

Figure 4A:
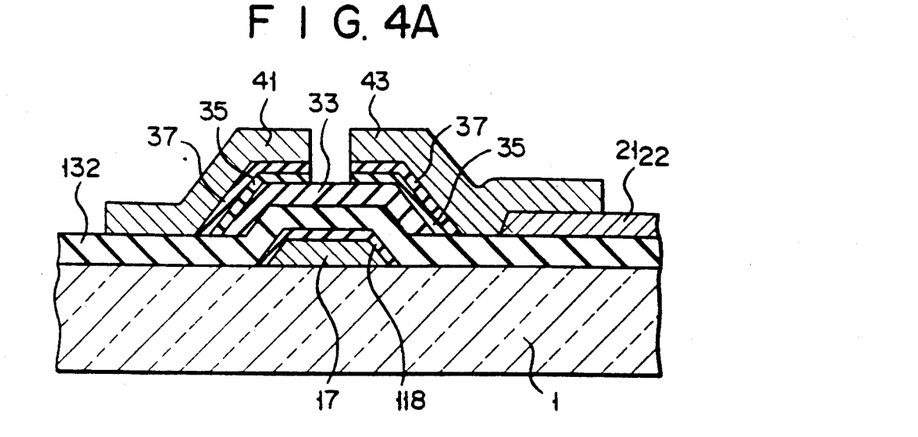
FIGS. 4A to 4B are cross-sectional views, as taken along lines A-A' and B-B' respectively in FIG. 2, showing another embodiment of this invention.
Figure 4B:
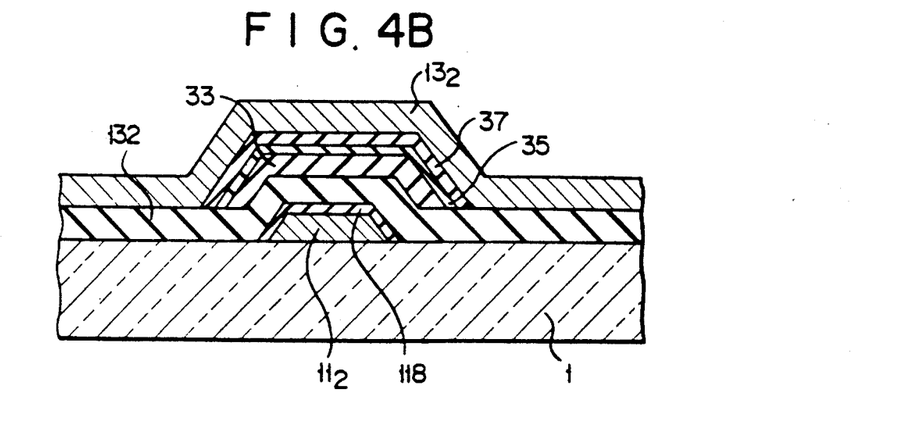

FIGS. 4A and 4B show another embodiment of this invention in which the surface of a gate electrode is anodically oxidized, FIG. 4A being a cross-sectional view as taken along line A-A' in FIG. 2 and FIG. 4B being a cross-sectional view as taken along line B-B' in FIG. 2.

Subsequent to the formation of address line 11 and gate electrode 17, anodic oxidation film 118 was formed on the surface of the resultant structure, noting that the anodic oxidation was conducted in 0.01 wt % citric acid solution according to this invention. Then 200 nm-thick $SiO_2$ film 132 was formed by a plasma enhanced CVD on the whole surface of the resultant structure. Then undoped a-Si film 33, n+ type a-Si film 35 and Mo film 37 were sequentially formed with their thicknesses the same as those shown in the previous embodiment. Display electrode 21, source electrode 41 and drain electrode 43 were formed in the same way.

In the active matrix substrate of this embodiment a thin-film transistor was formed with anodic oxidation film 118 and $SiO_2$ film 132 as a gate insulating film. In the respective intersection of address line 11 and data line 13, a multi-layered film of a-Si film 33, n+ type a-Si film 35 and Mo film 37 is formed on an insulating film of anodic oxidation film 118 and $SiO_2$ film 132 to provide an insulating interlayer.

Figure 5:
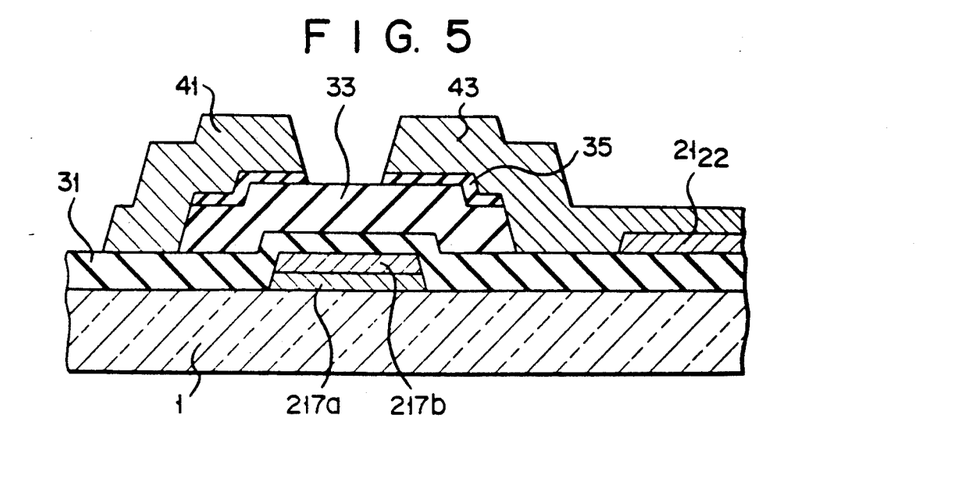
FIG. 5 is a cross-sectional view, as taken along line A-A' in FIG. 2, with an underlying metal film used.

The active matrix substrate will be described below with reference to FIG. 5. A gate electrode integral with the address line was formed, as a multi-layered film of 30 nm-thick Mo-Ta alloy film (80% of Ta) $217a$ as an underlying metal film and 170 nm-thick Mo-Ta alloy film (95% of Ta) $217b$ as an overlying metal film, on glass substrate 1. Subsequent to the formation of the gate electrode, washing was carried out in the same way as in the previous embodiment. 150 nm-thick $SiO_2$ film 118 as a gate insulating film was deposited by the CVD method on the surface of the resultant structure. Then 300 nm-thick a-Si film (undoped) 33 and 50 nm-thick a-Si film of an n+ type were sequentially deposited on the surface of the resultant structure, thus forming an island pattern at the TFT area. Source electrode 41 and drain electrode 43 were formed as an Al layer on the surface of the resultant structure, noting that source electrode 41 was formed integral with data line 13 as set forth above. Subsequent to the formation of the island-like a-Si film, ITO pixel electrode 21 was formed adjacent to that a-Si film and drain electrode 43 was electrically connected to pixel electrode 21. In this way a liquid crystal display device was fabricated which had a surface area of 19.2 cm×25.6 cm, pixel pitch of 400 μm and address line of 30 μm in width.

In this embodiment, address line 11 had a resistance of 12.8KΩ. In this connection it is to be noted that an address line was formed by the other materials and it is found that, in these other materials, Ti, Cr, Mo, Ta and Mo-Ta alloy (60% of Ta) were 200.5KΩ, 55.4KΩ, 22.6KΩ, 100.9KΩ and 19.2KΩ, respectively.

Although explanation has been made of the active matrix type liquid crystal display device using a-Si TFT's, this invention is equally applied to an a-Si diode and liquid crystal display device using an MIM (metal insulator metal) device.

Figure 6:
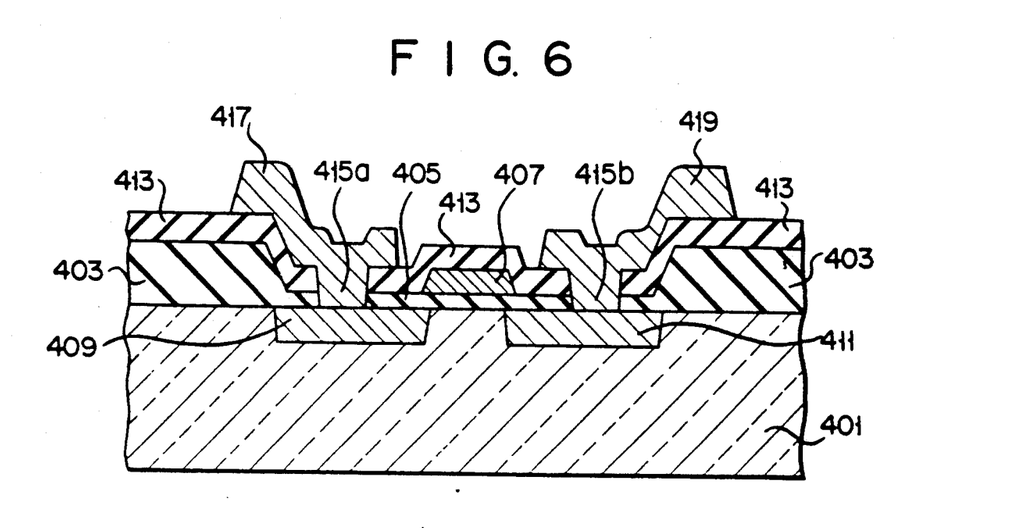
FIG. 6 is a cross-sectional view showing a MOS transistor according to another embodiment of this invention when no underlying metal film is used.

FIG. 6 shows a MOS transistor area of an embodiment which uses the electrode interconnection material as a gate electrode interconnection area in a MOS integrated circuit. Subsequent to the formation of field insulating film 403 on p-type single-crystalline Si substrate 401 with a resistivity of several ohm centimeters, 40 nm-thick gate oxide film 405 was formed by a thermal oxidation on the device area. Then a 300 nm-thick Mo (60 atomic percent) —Ta (40 atomic percent) alloy film was formed by a sputtering method and the surface of the resultant structure was subjected by a PEP and dry etching to a patterning to provide a taper-edge gate electrode 407. P ions were implanted into the surface of the resultant structure at a level $1 \times 10^{15}$ dose/cm$^2$ and 100 KeV with gate electrode 407 as a mask and the surface of the resultant structure was thermally treated at 1000° C. for 30 minutes to provide source and drain regions 409 and 411. The resistivity of gate electrode 407 was decreased by a heat-treating step to $1.3 \times 10^{-5}$ Ω·cm. Then, 1 μm-thick CVD oxide film 413 was formed on the surface of the resultant structure, followed by the formation of contact holes 415a and 415b. Finally, an aluminum film was deposited on the surface of the resultant structure and a patterning step was formed to provide source and drain electrodes 417 and 419.

According to this invention the resistivity of the gate electrode is 1/5 in comparison with the case where use is made of a conventional MoSi$_2$ film, obtaining a shorter gate delay time circuit characteristic. Thus there occurs no reaction of the gate electrode with the underlying gate oxide film even under a heat treatment of 1000° C., affording the device characteristic of high reliability.

Figure 7:
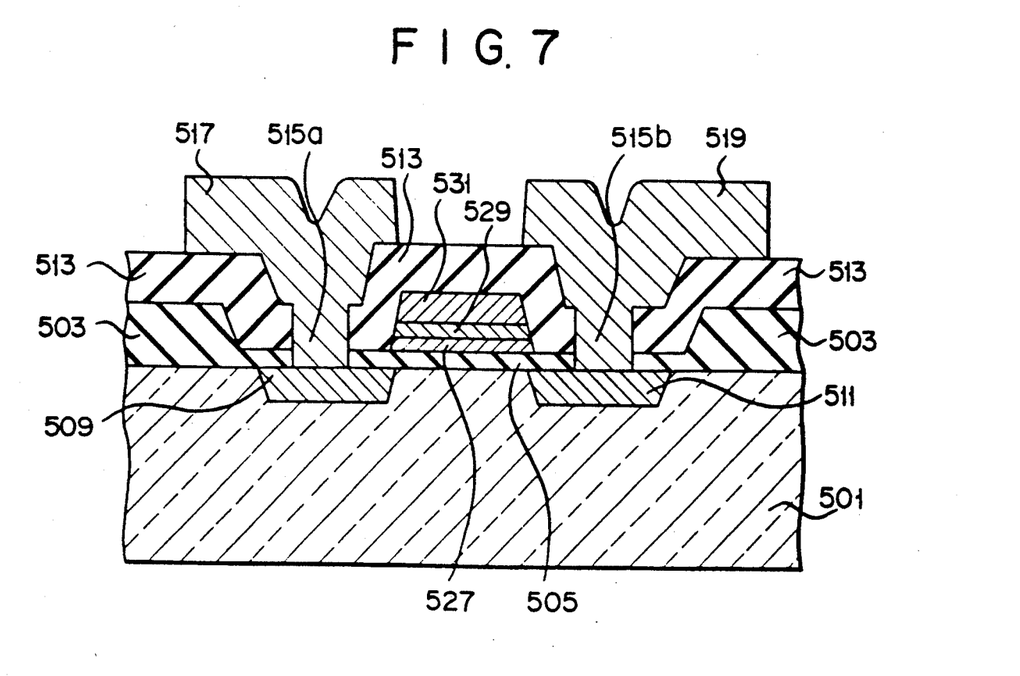
FIG. 7 is a cross-sectional view showing a MOS transistor according to another embodiment of this invention when an underlying metal film is used.

Explanation will be made of an embodiment, with reference to FIG. 7, where a gate electrode is formed with the use of an underlying metal film. Field insulating film 503 was formed on p type Si substrate 501 with a resistivity of a few ohm centimeters and 30 nm-thick gate oxide film 505 was formed by a thermal oxidation on a device area. Then 20 nm-thick MoSi$_2$ film 527, 20 nm-thick Mo film 529 and 200 nm-thick Mo-Ta alloy (95 atomic percent) film 531 were sequentially deposited on the surface of the resultant structure and this structure was heat-treated for 30 minutes at 900° C. in which case the intermediate film (529) was transformed to MoSi$_2$ film. The resultant multi-layered film was tapered by a plasma etching process using CF$_4$ and O$_2$ to provide a gate electrode. Then P ions were implanted into the surface of the resultant structure at a level of $1 \times 10^{15}$/cm$^2$ and 100 KeV and the structure was heat treated for 30 minutes at 1000° C. to form source and drain regions 509 and 511. CVD oxide film 513 was formed on the whole surface of the resultant structure, followed by the formation of contact holes 515a and 515b. Finally, an Al film was deposited on the surface of that structure and a patterning was performed on the surface of the structure to provide source and drain electrodes 517 and 519.

In this embodiment the resistivity of the gate electrode interconnection was 1/5, upon comparison with the structure using a MoSi$_2$ film only and a shorter gate delay time resulted.

Figure 10:
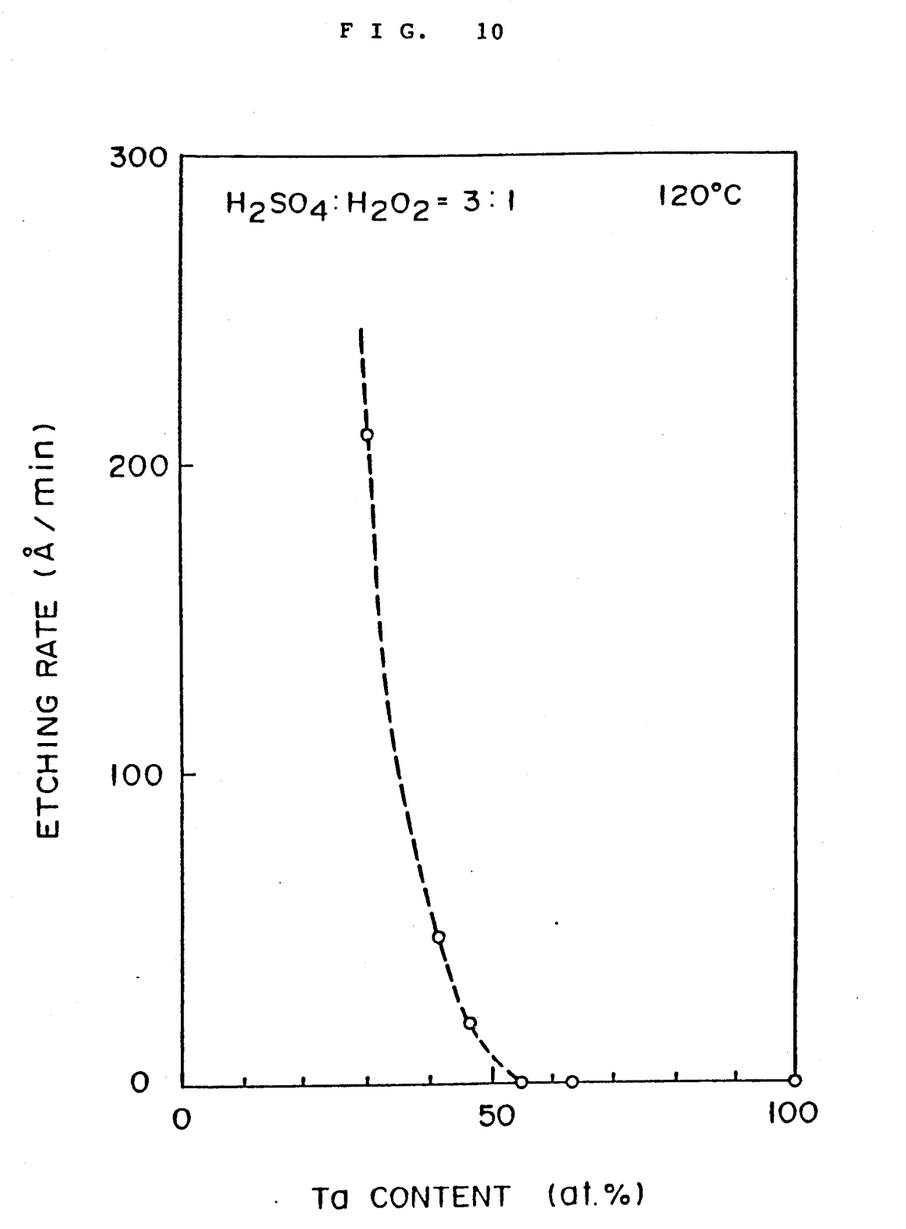
FIG. 10 is a graph showing the relationship between the Ta content of a Mo-Ta alloy film and the etching rate.

In the embodiment shown in FIG. 3, the Mo-Ta alloy gate electrode 16 was washed with a washing liquid of 80° C. having a low H$_2$SO$_4$ concentration. For effectively removing the organic material, particularly, resist, an additional experiment was conducted by using a washing liquid of higher temperature, i.e., 120° C., and higher sulfuric acid concentration, i.e., H$_2$SO$_4$:H$_2$O$_2$=3:1. FIG. 10 shows the relationship between the Ta content of a Mo-Ta alloy film and the acid resistance of the film obtained from the experiment. As seen from FIG. 10, a Mo-Ta alloy film is not corroded by an acid, if the Ta content of the film is at least 55 atomic %.

This invention is not restricted to the aforementioned embodiment. For example, an Mo-Ta alloy is obtained by a co-sputtering method with the Mo target and Ta target. It is also possible to obtain a similar alloy film through a thermal decomposition by organic gases containing an Mo and Ta. This invention can be applied not only to an Si film, such as an a-Si film, polycrystalline silicon film and single crystalline Si film but also to the other semiconductor material film, such as a CdSe, Te, GaAs, GaP film.

What is claimed is:

1. A driving circuit substrate for a display device, comprising:
    an insulator substrate;
    a plurality of address lines and data lines formed on said address lines with an insulation layer interposed therebetween intersecting each other on said substrate, the address line having a multi-layered structure including a first layer directly overlying a second layer, said first layer being formed of molybdenum-tantalum alloy containing from more than 84 atomic % to 100 atomic % of tantalum, said second layer being made of a metallic material having a body-centered cubic lattice structure and a lattice constant similar to that of molybdenum and tantalum;
    a plurality of thin-film transistors each formed at an intersection of said address and data lines, each of the transistors having a gate electrode connected to an address line, a source electrode connected to a data line, and a drain electrode; and
    a plurality of display electrodes connected to the drain electrodes of the thin-film transistors.

2. The driving circuit substrate according to claim 1, wherein said metallic material of said second layer of the address line is selected from the group consisting of V, Cr, Fe, Nb, W, Mo, and a molybdenum-tantalum alloy containing 30 to 84 atomic % of tantalum.

3. The driving circuit substrate according to claim 2, wherein said molybdenum-tantalum alloy for forming said second layer of the address line contains 55 to 84 atomic % of tantalum.

4. The driving circuit substrate according to claim 1, wherein said gate electrode of the thin-film transistor has a multilayered structure including a first layer directly overlying a second layer, said first layer of the gate electrode being formed of molybdenum-tantalum alloy containing from more than 84 atomic % to 100 atomic % of tantalum, said second layer of the gate electrode being made of a metallic material having a bodycentered cubic lattice structure and a lattice constant similar to that of molybdenum and tantalum, said gate electrode being formed integral with the address line.

5. The driving circuit substrate according to claim 4, wherein said metallic material of said second layer of the gate electrode is selected from the group consisting of V, Cr, Fe, Nb, W, Mo, and a molybdenum-tantalum alloy containing 30 to 84 atomic % of tantalum.

6. The driving circuit substrate according to claim 5, wherein said molybdenum-tantalum alloy for forming said second layer of the gate electrode contains 55 to 84 atomic % of tantalum.

7. The driving circuit substrate according to claim 1, wherein said thin-film transistor includes a semiconductor thin film formed over said gate electrode through a gate insulating film comprising an anodic oxidation film or thermal oxidation film.

8. The driving circuit substrate according to claim 1, wherein said drain and source electrodes are formed of the same material as said data line on the semiconductor thin film.

9. The driving circuit substrate according to claim 7, wherein an insulating interlay film comprising an anodic oxidation film or thermal oxidation film for the address line and a semiconductor thin film formed simultaneously with the semiconductor thin film for the transistor are formed between the respective address and data lines.

10. A driving circuit substrate for a display device, comprising:
  an insulator substrate;
  a plurality of address lines and data lines formed on said address lines with an insulation layer interposed therebetween intersecting each other on said substrate;
  a plurality of thin-film transistors each formed at an intersection of said address and data lines, each of the transistors having a gate electrode connected to an address line, a source electrode connected to a data line, and a drain electrode, said gate electrode having a multi-layered structure including a first layer directly overlying a second layer, said first layer being formed of molybdenum-tantalum alloy containing from more than 84 atomic % to 100 atomic % of tantalum, said second layer being made of a metallic material having a body-centered cubic lattice structure and a lattice constant similar to that of molybdenum and tantalum; and
  a plurality of display electrodes connected to the drain electrodes of the thin-film transistors.

11. The driving circuit substrate according to claim 10, wherein said metallic material of said second layer of the gate electrode is selected from the group consisting of V, Cr, Fe, Nb, W, Mo, and a molybdenum-tantalum alloy containing 30 to 84 atomic % of tantalum.

12. The driving circuit substrate according to claim 11, wherein said molybdenum-tantalum alloy for forming said second layer of the gate electrode contains 55 to 84 atomic % of tantalum.

13. The driving circuit substrate according to claim 10, wherein the address line has a multi-layered structure including a first layer directly overlying a second layer, said first layer of the address line being formed of molybdenum-tantalum alloy containing from more than 84 atomic % to 100 atomic % of tantalum, said second layer of the address line being made of a metallic material having a body-centered cubic lattice structure and a lattice constant similar to that of molybdenum and tantalum, said address line being formed integral with the gate electrode.

14. The driving circuit substrate according to claim 13, wherein said metallic material of said second layer of the address line is selected from the group consisting of V, Cr, Fe, Nb, W, Mo, and a molybdenum-tantalum alloy containing 30 to 84 atomic % of tantalum.

15. The driving circuit substrate according to claim 13, wherein said molybdenum-tantalum alloy for forming said second layer of the address line contains 55 to 84 atomic % of tantalum.

16. The driving circuit substrate according to claim 10, wherein said thin-film transistor includes a semiconductor thin film formed over said gate electrode through a gate insulating film comprising an anodic oxidation film or thermal oxidation film.

17. The driving circuit substrate according to claim 10, wherein said drain and source electrodes are formed of the same material as said data line on the semiconductor thin film.

18. The driving circuit substrate according to claim 16, wherein an insulating interlayer film comprising an anodic oxidation film or thermal oxidation film for the address line and a semiconductor thin film formed simultaneously with the semiconductor thin film for the transistor are formed between the respective address and data lines.

* * * * *